(12) United States Patent
Han et al.

(10) Patent No.: US 10,286,416 B2
(45) Date of Patent: May 14, 2019

(54) MASK TENSION WELDING DEVICE FOR THIN FILM DEPOSITION

(71) Applicant: SAMSUNG DISPLAY CO., LTD., Yongin-si, Gyeonggi-do (KR)

(72) Inventors: Jeongwon Han, Yongin-si (KR); Myungkyu Kim, Yongin-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 487 days.

(21) Appl. No.: 14/994,941

(22) Filed: Jan. 13, 2016

(65) Prior Publication Data

US 2017/0001259 A1    Jan. 5, 2017

(30) Foreign Application Priority Data

Jul. 1, 2015  (KR) .......................... 10-2015-0094002

(51) Int. Cl.
| | |
|---|---|
| *B23K 26/21* | (2014.01) |
| *B05B 12/20* | (2018.01) |
| *B23K 26/146* | (2014.01) |
| *B23K 37/04* | (2006.01) |
| *B23K 26/12* | (2014.01) |

(Continued)

(52) U.S. Cl.
CPC ............ *B05B 12/20* (2018.02); *B23K 26/037* (2015.10); *B23K 26/127* (2013.01); *B23K 26/14* (2013.01); *B23K 26/146* (2015.10); *B23K 26/244* (2015.10); *B23K 37/0435* (2013.01); *B23K 2103/05* (2018.08); *B23K 2103/26* (2018.08);

(Continued)

(58) Field of Classification Search
CPC ...... B23K 26/21; B23K 26/146; B23K 26/10; B23K 26/12; B23K 26/127; B23K 26/22; B23K 26/24; B23K 26/244; B23K 26/122; B23K 37/435; B23K 37/0408; C23C 26/00; C23C 14/042; C23C 16/042; B05B 15/045; B05C 21/005
USPC .......... 219/121.63, 121.64, 121.82; 118/720, 118/721, 503, 504, 505; 428/209; 228/212, 213
See application file for complete search history.

(56) References Cited

U.S. PATENT DOCUMENTS

| | | | |
|---|---|---|---|
| 6,955,726 B2 * | 10/2005 | Kang ................... | C23C 14/042 118/504 |
| 7,393,712 B2 * | 7/2008 | Smith .................. | B81B 7/0061 257/E21.502 |

(Continued)

FOREIGN PATENT DOCUMENTS

| | | |
|---|---|---|
| JP | 2014-135246 A | 7/2014 |
| KR | 2009-0052202 A | 5/2009 |

(Continued)

*Primary Examiner* — Jimmy Chou
(74) *Attorney, Agent, or Firm* — Lee & Morse, P.C.

(57) ABSTRACT

A mask tension welding device for welding a mask for thin film deposition on a mask frame, the mask tension welding device including a tension unit to pull the mask in one direction; a pressurizing unit to press the mask to the mask frame, the pressuring unit including an upper housing, a lower housing coupled to the upper housing, a window between the upper housing and the lower housing, a space in the lower housing into which a fluid is injectable, and an inlet and an outlet to provide a passage through which the fluid is injected and discharged; and a laser welding unit to weld the mask and the mask frame to each other.

17 Claims, 8 Drawing Sheets

(51) Int. Cl.
  *B23K 26/14* (2014.01)
  *B23K 26/035* (2014.01)
  *B23K 26/244* (2014.01)
  *H01L 51/00* (2006.01)
  *H01L 27/12* (2006.01)
  *B23K 103/04* (2006.01)
  *B23K 103/18* (2006.01)

(52) U.S. Cl.
  CPC ....... *H01L 27/1214* (2013.01); *H01L 51/0011* (2013.01)

(56) References Cited

U.S. PATENT DOCUMENTS

| | | | | |
|---|---|---|---|---|
| 7,592,571 B2* | 9/2009 | Theodos | A47J 37/1261 | 219/430 |
| 8,013,270 B2* | 9/2011 | Shimoda | C23C 16/45517 | 219/121.6 |
| 8,696,815 B2* | 4/2014 | Choi | C23C 14/042 | 118/726 |
| 8,707,889 B2* | 4/2014 | Lee | H01L 51/5203 | 118/213 |
| 8,876,975 B2* | 11/2014 | Choi | C23C 14/044 | 118/504 |
| 8,894,458 B2* | 11/2014 | Song | C23C 14/042 | 313/504 |
| 8,916,237 B2* | 12/2014 | Lee | C23C 14/24 | 118/715 |
| 8,951,610 B2* | 2/2015 | Chang | C23C 14/12 | 118/715 |
| 8,993,360 B2* | 3/2015 | Choi | C23C 14/042 | 438/22 |
| 9,121,095 B2* | 9/2015 | Lee | C23C 14/24 | |
| 9,279,177 B2* | 3/2016 | Choi | C23C 14/044 | |
| 9,388,488 B2* | 7/2016 | Lee | C23C 14/042 | |
| 9,567,662 B2* | 2/2017 | Kim | H01L 51/0011 | |
| 9,802,276 B2* | 10/2017 | Kim | B23K 37/0435 | |
| 2001/0018309 A1* | 8/2001 | Nishiki | H01J 9/142 | 445/30 |
| 2003/0101932 A1* | 6/2003 | Kang | C23C 14/042 | 118/504 |
| 2003/0221614 A1* | 12/2003 | Kang | C23C 14/042 | 118/504 |
| 2004/0115342 A1* | 6/2004 | Shigemura | H01L 51/0004 | 427/143 |
| 2006/0013960 A1* | 1/2006 | Chiang | C23C 18/00 | 427/421.1 |
| 2006/0175308 A1* | 8/2006 | Hughes | B23K 26/0096 | 219/121.63 |
| 2006/0237129 A1* | 10/2006 | Chen | B23K 26/0604 | 156/272.8 |
| 2006/0237401 A1* | 10/2006 | Amesbury | B23K 26/0604 | 219/121.63 |
| 2007/0178225 A1* | 8/2007 | Takanosu | C23C 14/243 | 427/69 |
| 2008/0029496 A1* | 2/2008 | Lin | A63B 53/0466 | 219/121.64 |
| 2008/0099452 A1* | 5/2008 | Akiyama | B23K 26/1482 | 219/121.67 |
| 2009/0107966 A1* | 4/2009 | Wojcik | B23K 26/1476 | 219/121.72 |
| 2009/0127236 A1* | 5/2009 | Hong | G03F 7/12 | 219/121.64 |
| 2010/0148414 A1* | 6/2010 | Poole | B25B 5/12 | 269/228 |
| 2011/0146573 A1* | 6/2011 | Park | C23C 14/042 | 118/712 |
| 2011/0168087 A1* | 7/2011 | Lee | C23C 14/042 | 118/504 |
| 2011/0171768 A1* | 7/2011 | Hong | C23C 14/042 | 438/34 |
| 2012/0183676 A1* | 7/2012 | Sonoda | C23C 14/042 | 427/8 |
| 2012/0222287 A1* | 9/2012 | Wilturner | B25B 5/003 | 29/559 |
| 2012/0279445 A1* | 11/2012 | Kim | H01L 51/0011 | 118/504 |
| 2012/0299016 A1* | 11/2012 | Choi | C23C 14/042 | 257/79 |
| 2012/0299024 A1* | 11/2012 | Lee | H01L 51/5203 | 257/88 |
| 2012/0325143 A1* | 12/2012 | Kang | C23C 14/042 | 118/504 |
| 2013/0040047 A1* | 2/2013 | Karaki | C23C 14/042 | 427/66 |
| 2013/0181209 A1* | 7/2013 | Sonoda | C23C 14/042 | 257/40 |
| 2013/0199443 A1* | 8/2013 | Kim | B05B 12/20 | 118/504 |
| 2013/0318774 A1* | 12/2013 | Kang | B05C 21/005 | 29/592 |
| 2014/0084262 A1* | 3/2014 | Kim | C23C 14/024 | 257/40 |
| 2014/0130735 A1* | 5/2014 | Kim | H01L 51/0011 | 118/504 |
| 2014/0131667 A1* | 5/2014 | Chang | H01L 51/56 | 257/40 |
| 2014/0158044 A1* | 6/2014 | Han | C23C 14/042 | 118/504 |
| 2014/0158045 A1* | 6/2014 | Lee | C23C 14/042 | 118/505 |
| 2014/0331926 A1* | 11/2014 | Kim | B23K 37/0408 | 118/504 |
| 2015/0140832 A1* | 5/2015 | Quinn | H01L 51/56 | 438/761 |

FOREIGN PATENT DOCUMENTS

| KR | 2011-0046780 A | 5/2011 |
|---|---|---|
| KR | 2011-0046782 A | 5/2011 |
| KR | 2013-0020325 A | 2/2013 |
| KR | 2013-0134707 A | 12/2013 |

* cited by examiner

MASK TENSION WELDING DEVICE FOR THIN FILM DEPOSITION

CROSS-REFERENCE TO RELATED APPLICATION

Korean Patent Application No. 10-2015-0094002, filed on Jul. 1, 2015, in the Korean Intellectual Property Office, and entitled: "Mask Tension Welding Device for Thin Film Deposition," is incorporated by reference herein in its entirety.

BACKGROUND

1. Field

Embodiments relate to a mask tension welding device for thin film deposition.

2. Description of the Related Art

Organic light-emitting display apparatuses including a thin film transistor (TFT) may be used in mobile devices, such as smart phones, tablet personal computers, laptop computers, digital cameras, camcorders, and personal digital assistants, or electronic devices, such as desktop computers, televisions, and outdoor billboards.

Thin films of the organic light-emitting display apparatuses may be formed by deposition. The thin films may be formed by disposing on a substrate a mask having the same pattern as the thin films formed on the substrate, and depositing a raw material of the thin films on the substrate.

SUMMARY

Embodiments are directed to a mask tension welding device for thin film deposition.

The embodiments may be realized by providing a mask tension welding device for welding a mask for thin film deposition on a mask frame, the mask tension welding device including a tension unit to pull the mask in one direction; a pressurizing unit to press the mask to the mask frame, the pressuring unit including an upper housing, a lower housing coupled to the upper housing, a window between the upper housing and the lower housing, a space in the lower housing into which a fluid is injectable, and an inlet and an outlet to provide a passage through which the fluid is injected and discharged; and a laser welding unit to weld the mask and the mask frame to each other.

The tension unit may include a mask tension clamp to pull ends of the mask and to fix the ends on the mask frame.

The pressurizing unit may pressurize the mask on the mask frame to make facing surfaces of the mask frame and the mask adhere to each other.

The upper housing may include a first block in which a first hollow is formed, the lower housing may include a second block in which a second hollow is formed, and the first block may be coupled with the second block.

A first bent portion may be bent along a circumferential area of the first hollow at a lower end of the first block, a second bent portion may be bent along a circumferential area of the second hollow at an upper end of the second block facing the lower end of the first block, and the first bent portion and the second portion are coupled with each other.

The window may be between the first hollow and the second hollow to separate the first hollow and the second hollow from each other.

The window may include a material through which a laser beam irradiated from the laser welding unit passes.

The window may be glass, quartz, or a transparent polymer.

The space into which the fluid is injectable may be bounded by the second block having the second hollow, the window, and the mask.

The fluid may be a gas.

The fluid may be a liquid.

A pressure applied to the mask may be controllable in response to an amount of the fluid injected into the space.

The pressure of the fluid may be applied to an entire area in which the mask and the mask frame are welded.

A laser beam irradiated from the laser welding unit may pass through the window and the fluid to be irradiated on an upper surface of the mask.

The pressurizing unit may include a first o-ring in an area in which the first block and the second block are coupled to each other.

The pressurizing unit may include a second o-ring in an area in which the second block and the mask contact each other.

The second o-ring may include an elastic material.

The inlet through which the fluid is injected may be on one side of the lower housing, and the outlet through which the fluid is discharged may be on another side of the lower housing.

The upper housing may include a connecting passage connecting the inlet, the second hollow, and the outlet.

The mask may include at least one mask stick, and ends of the mask stick may be welded on the mask frame.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
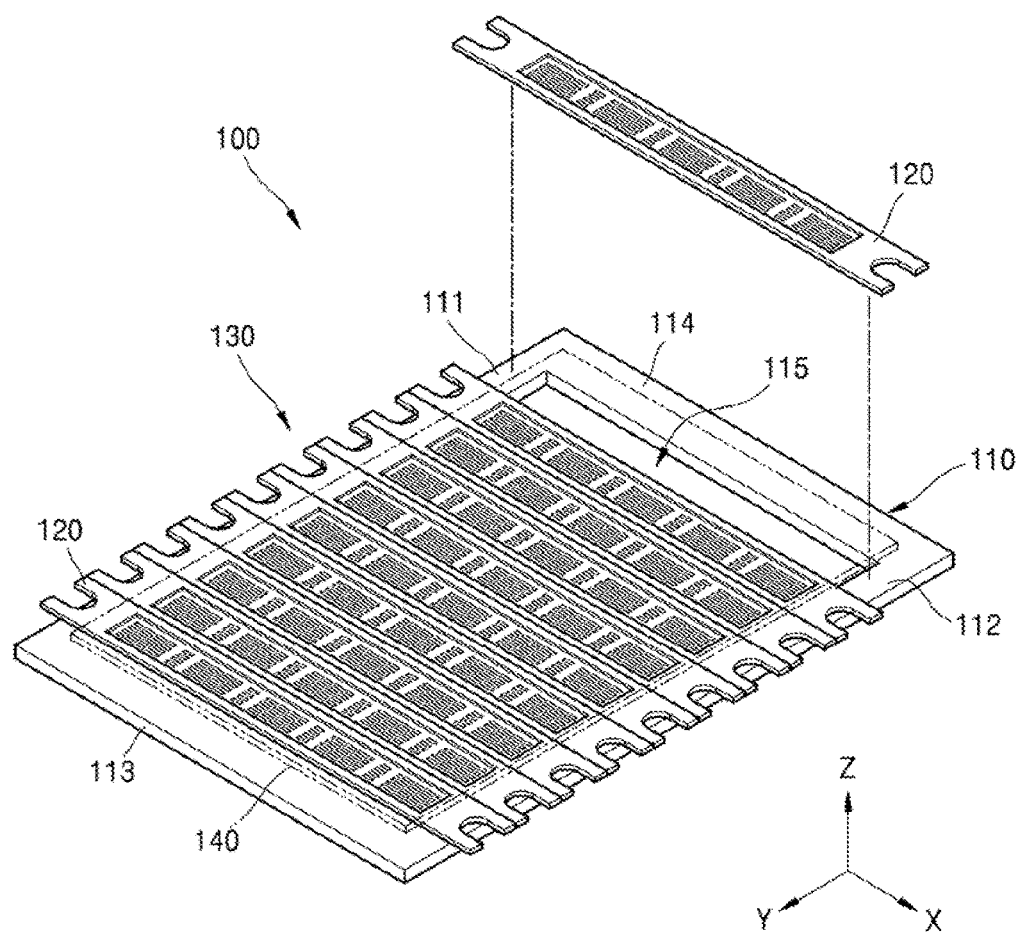
FIG. 1 illustrates a perspective view of a mask assembly for thin film deposition, according to an exemplary embodiment.

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening elements may also be present. In addition, it will also be understood that when an element is referred to as being "between" two elements, it can be the only element between the two elements, or one or more intervening elements may also be present. Like reference numerals refer to like elements throughout.

It will be understood that although the terms "first," "second," etc. may be used herein to describe various components, these components should not be limited by these terms. These components are only used to distinguish one component from another.

Meanwhile, the terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises," "includes," including," and/or "comprising" used herein specify the presence of stated features, integers, steps, operations, members, components, and/or groups thereof, but do not preclude the presence or addition of one or more other features, integers, steps, operations, members, components, and/or groups thereof.

As used herein, the term "and/or" includes any and all combinations of one or more of the associated listed items. Expressions such as "at least one of," when preceding a list of elements, modify the entire list of elements and do not modify the individual elements of the list.

Reference will now be made in detail to embodiments of a mask tension welding device for thin film deposition, examples of which are illustrated in the accompanying drawings.

FIG. 1 illustrates a perspective view of a mask assembly 100 for thin film deposition, according to an exemplary embodiment.

Referring to FIG. 1, the mask assembly 100 may include a mask frame 110 and a mask 130 having a plurality of mask sticks 120.

The mask frame 110 may have an opening 115, and may include a plurality of frames, e.g., first to fourth frames 111 to 114, surrounding the opening 115. The first to fourth frames 111 to 114 may be connected to one another.

The mask frame 110 may include the first frame 111 and the second frame 112 facing each other, e.g., in a direction X and extending in a direction Y, and the third frame 113 and the fourth frame 114 facing each other, e.g., in the direction Y and extending in the direction X. The first frame 111, the second frame 112, the third frame 113, and the fourth frame 114 may be connected to one another, thereby forming a rectangular or square frame. The mask frame 110 may include a material that is less susceptible to being transformed or otherwise affected during welding, e.g., a metal having a high rigidity.

The mask 130 may be mounted on the mask frame 110. In order to form precise deposition patterns, an adhesion between the mask 130 and a substrate 140 on the mask 130 may be improved and a shadow may be decreased. The mask 130 may be manufactured by using a thin plate. Materials of the mask 130 may include stainless steel, Invar, nickel (Ni), Cobalt (Co), a nickel alloy, a nickel-cobalt alloy, etc.

The mask 130 may include the plurality of mask sticks 120 that are separated from one another and/or repeatedly or sequentially arranged in the direction Y, so as not to sag due to its weight. According to exemplary embodiments, so long as a width of the mask 130 is less than a length of the mask 130 corresponding to a tension direction of the mask 130, the mask 130 may not be limited to a particular structure.

In an implementation, the mask sticks 120 may be separated from one another in one direction (the direction Y) crossing the tension direction (the direction X). In an implementation, the plurality of mask sticks 120 may be sequentially arranged between the third frame 113 and the fourth frame 114, and ends, e.g., both ends, of each mask stick 120 may be fixed by being welded on the first frame 111 and the second frame 112. The plurality of mask sticks 120 may cover the opening 115.

Figure 2:
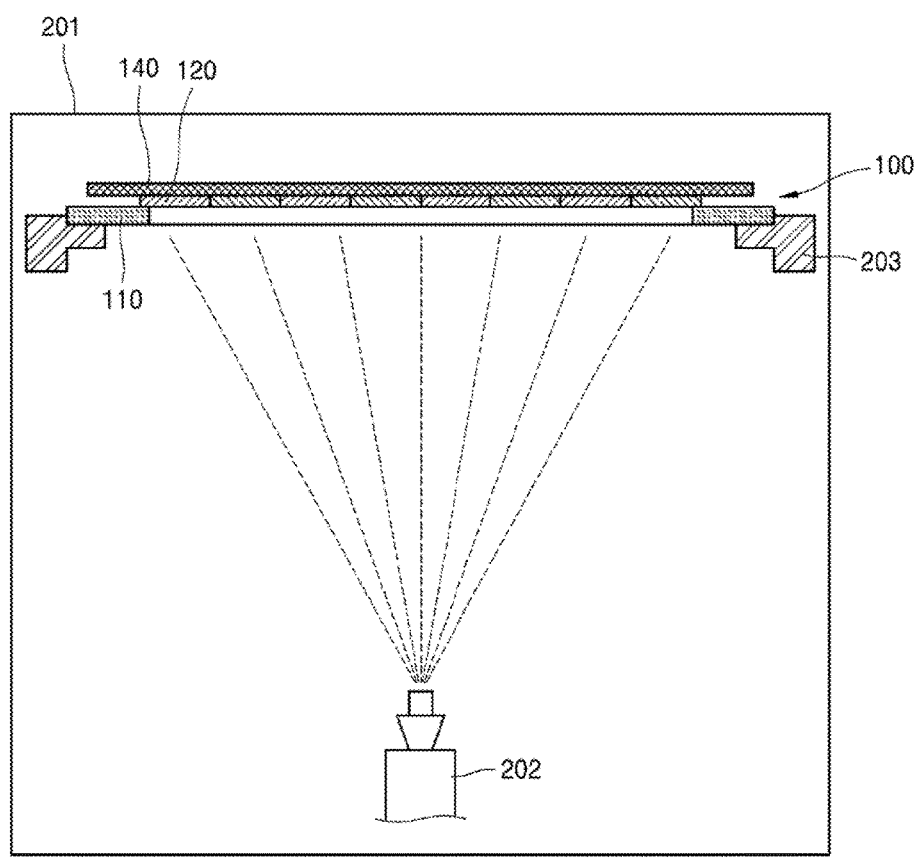
FIG. 2 illustrates a side view of a shape in which a deposition layer is formed on a substrate by using the mask assembly for thin film deposition of FIG. 1.

FIG. 2 illustrates a side view of an example in which a deposition material is deposited by using the mask assembly 100 of FIG. 1.

Referring to FIG. 2, a vacuum chamber 201 may be provided to deposit, e.g., an organic emission layer or an electrode of an organic light-emitting display apparatus by using the mask assembly 100.

A deposition source 202 may be located at a lower part of the vacuum chamber 201, and the mask assembly 100 may be above the deposition source 202. The mask assembly 100 may include the plurality of mask sticks 120 as illustrated in FIG. 1. The mask sticks 120 may be on the mask frame 110. The substrate 140 for deposition, e.g., the deposition target, may be located above the mask sticks 120. An additional supporting member 203 for fixing the mask assembly 100 may further be provided at a boundary of the mask assembly 100.

A process of depositing a deposition material on the substrate 140 will be described briefly.

First, the mask assembly 100 may be fixed on the supporting member 203, and the substrate 140 for deposition may be placed on the mask sticks 120. Next, the deposition material may be sprayed toward the mask assembly 100 from the deposition source 202 (located at a lower portion of the vacuum chamber 201). Then, the deposition material may selectively pass through the mask sticks 120 to be deposited on a surface of the substrate 140.

According to an exemplary embodiment, in order to, e.g., accurately, form the deposition pattern on a desired location on the substrate 140, the mask sticks 120 may be smoothly welded on the mask frame 110. For example, an adhesive force on an area in which the mask frame 110 and the mask sticks 120 are welded may be great.

Figure 3:
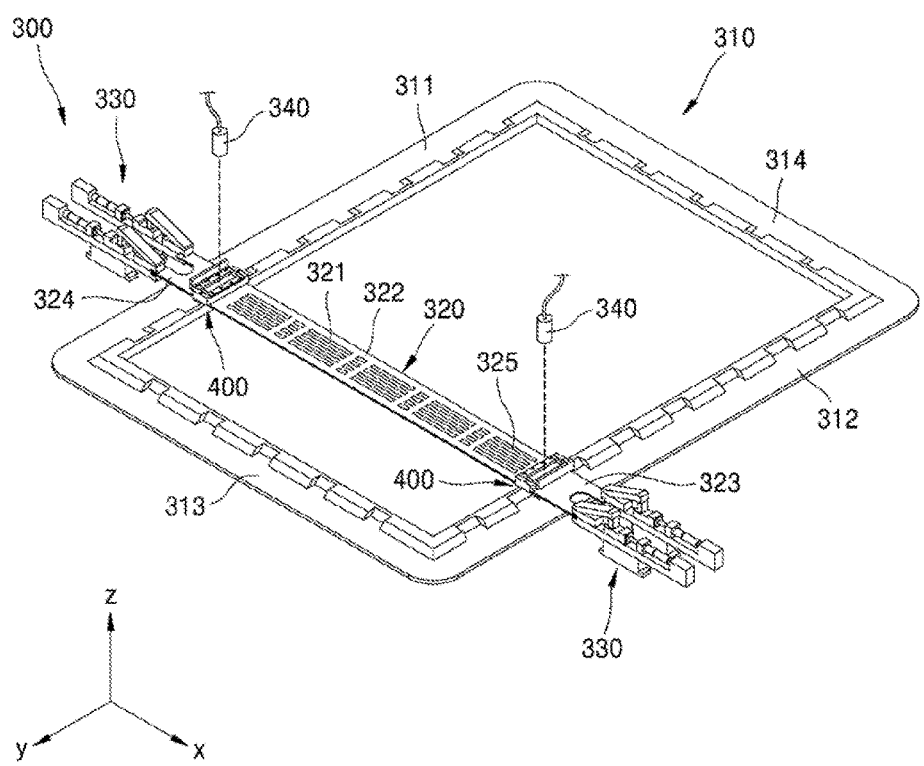
FIG. 3 illustrates a perspective view of a mask tension welding device for thin film deposition, according to an exemplary embodiment.
Figure 4:
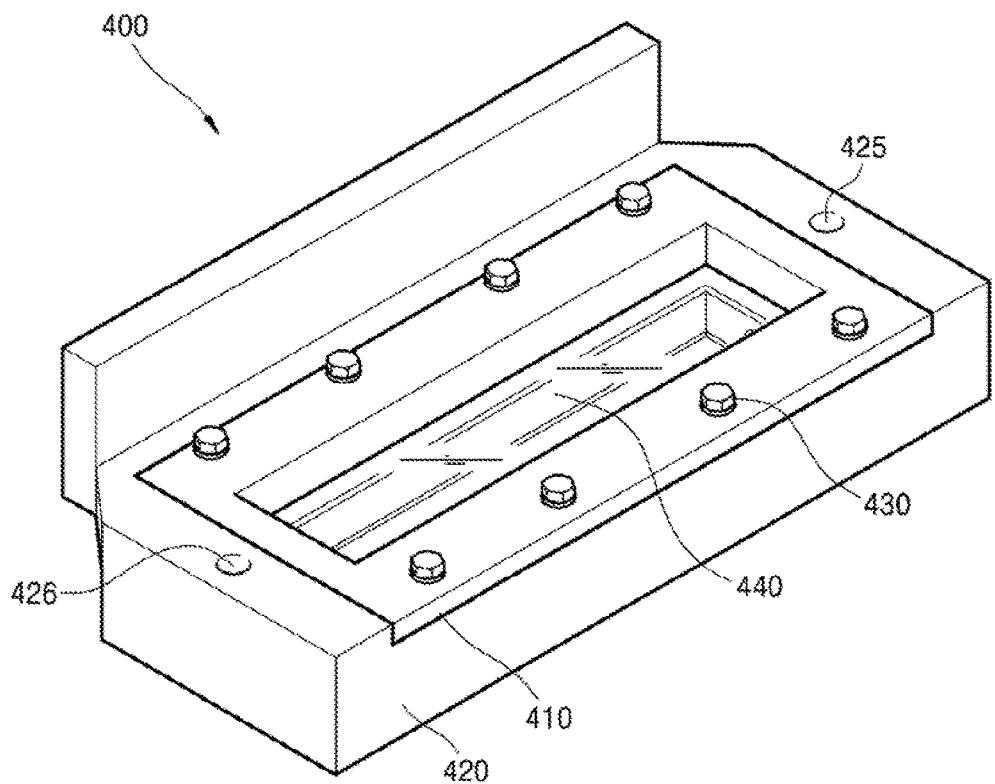
FIG. 4 illustrates a perspective view of a pressurizing unit of FIG. 3.
Figure 5:
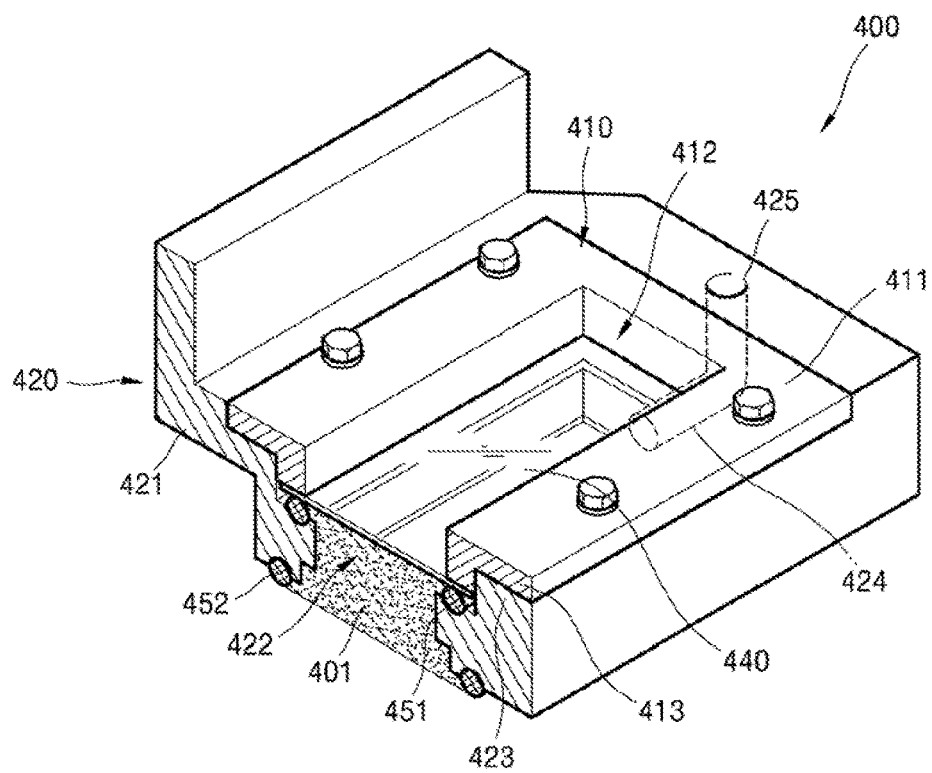
FIG. 5 illustrates a perspective view of a portion of the pressurizing unit of FIG. 4.
Figure 6:
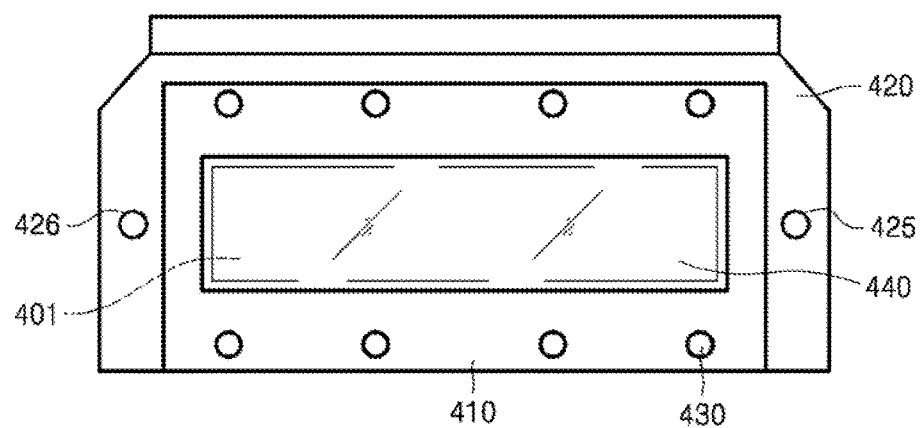
FIG. 6 illustrates a plan view of the pressurizing unit of FIG. 4.
Figure 7:
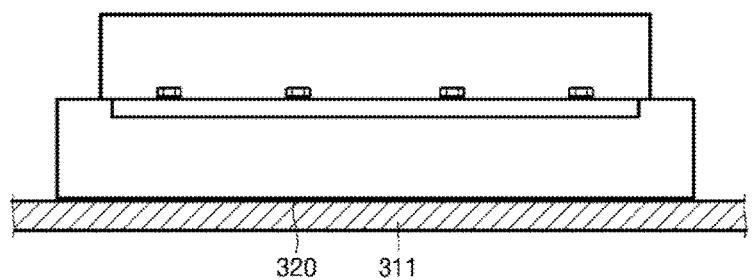
FIG. 7 illustrates a side view of the pressurizing unit of FIG. 4.

FIG. 3 illustrates a perspective view of a mask tension welding device 300 for thin film deposition according to an exemplary embodiment. FIG. 4 illustrates a perspective view of a pressurizing unit 400 of FIG. 3. FIG. 5 illustrates a perspective view of a portion of the pressurizing unit 400 of FIG. 4. FIG. 6 illustrates a plan view of the pressurizing unit 400 of FIG. 4. FIG. 7 illustrates a side view of the pressurizing unit 400 of FIG. 4.

Referring to FIGS. 3 through 7, a mask frame 310 may be a rectangular or square frame. The mask frame 310 may include a first frame 311 and a second frame 312 facing each other, e.g., in a direction X and extending in a direction Y, and a third frame 313 and a fourth frame 314 facing each other, e.g., in the direction Y and extending the direction X.

A plurality of mask sticks 320 may be formed or provided on the mask frame 310 and may be separated from one another and/or sequentially arranged adjacent to one another in the direction Y. A width of each mask stick 320 may be less than a length of the mask stick 320 corresponding or relative to a tension direction of the mask stick 320. For example, the tension direction of the mask stick 320 may be along a lengthwise direction of the mask stick 320. A plurality of deposition pattern units 321 may be arranged on the mask stick 320 and distanced or spaced apart from one another. The deposition pattern units 321 may have the same patterns as deposition layers to be deposited on a substrate, e.g., on which the deposition is to be performed. A rib 322 may be between adjacent deposition pattern units 321. The rib 322 may connect the deposition pattern units 321, which are arranged to be adjacent to each other in a lengthwise direction of the mask stick 320.

According to an exemplary embodiment, welding points, in which the mask frame 310 and the mask stick 320 are welded with each other, may be located between an outermost deposition pattern unit 325 and ends, e.g., both ends 323 and 324, of the mask stick 320.

The mask stick 320 may be welded to the mask frame 310 by pulling the, e.g., both, ends 323 and 324 of the mask stick 320 in the tension direction (e.g., the direction X). For example, a first end 323 of the mask stick 320 may be pulled in the lengthwise direction thereof, and a second end 324 of the mask stick 320 may be pulled in an opposite direction. In an implementation, the first end 323 of the mask stick 320 may be welded on the first frame 311, and the second end 324 of the mask stick 320 may be welded on the second frame 312.

According to an exemplary embodiment, in order to smoothly weld the mask stick 320 on the frame 310, the mask tension welding device 300 may be used.

This aspect will be described in more detail.

The mask tension welding device 300 may include a tension unit 330 (e.g., a tensioner), the pressurizing unit 400 (e.g., a pressurizer), and a laser welding unit 340 (e.g., a laser welder).

The mask stick 320 may be pulled in the lengthwise direction thereof (the direction X). The mask stick 320 may be pulled by the tension unit 330. For example, the first end 323 and the second end 324 of the mask stick 320 may be located on the first frame 311 and the second frame 312 in a pulled state, e.g., when the mask stick 320 is in the pulled state. The tension unit 330 may fix the mask stick 320 on the mask frame 310 by applying a tensile force to the mask stick 320.

According to an exemplary embodiment, the tension unit 330 may be a mask tension clamp. The tension unit 330 may pull the mask stick 320 by clamping the first end 323 and the second end 324 of the mask stick 320.

The pressurizing unit 400 may make the mask stick 320 adhere to the mask frame 310, e.g., may press the mask stick 320 to the mask frame 310. Pressurizing units 400 may be provided on locations adjacent to the first end 323 and the second end 324 of the mask stick 320. For example, the pressurizing units 400 may be between the outermost deposition pattern unit 325 and the, e.g., both, ends 323 and 324 of the mask stick 320.

The pressurizing units 400 may pressurize or press the mask stick 320 against the mask frame 310 from above. Accordingly, facing surfaces of the mask frame 310 and the mask stick 320 may adhere to or be coupled with each other.

The pressurizing unit 400 may include an upper housing 410 and a lower housing 420 coupled to the upper housing 410.

The upper housing 410 may include a first block 411. The first block 411 may be a rectangular or square frame. The first block 411 may surround a first hollow 412. In an implementation, the first block 411 may be the square frame.

At a lower end of the first block 411, a first bent portion 413 may be bent along a circumferential portion of the first hollow 412. The first bent portion 413 may provide a mounting surface for the lower housing 420.

The lower housing 420 may include a second block 421. The second block 421 may have a shape to accommodate, e.g., complementary to, the first block 411. A second hollow 422 may be formed in the second block 421. The second block 421 may surround the second hollow 422. The first hollow 412 and the second hollow 422 may be formed in the same location in a vertical direction, e.g., may be vertically aligned with one another.

At an upper end of the second block 421 (facing the lower end of the first block 411), a second bent portion 423 may be formed along a circumferential portion of the second hollow 422. The second bent portion 432 may provide a mounting surface for the upper housing 410.

The first block 411 may be coupled to the second block 421. For example, when the first block 411 is mounted on the second block 421, a mounting surface of the first bent portion 413 may be located on and/or coupled with a mounting surface of the second bent portion 423. The first block 411 and the second block 421 may be solidly fixed to each other by a coupling member 430, e.g., a bolt.

A window 440 may be formed or provided between the upper housing 410 and the lower housing 420. The window 440 may be between the first hollow 412 (surrounded by the first block 411) and the second hollow 422 (surrounded by the second block 421). The window 440 may separate spaces (in which the first hollow 412 and the second hollow 422 are formed) from each other.

The window 440 may include or be formed of a material through which a laser beam (irradiated from the laser welding unit 340) may pass. In an implementation, the window 440 may be or include, e.g., glass, quartz, and/or a transparent polymer.

A fluid 401 may be injected into or otherwise provided in a space formed by the lower housing 420. In an implementation, the fluid 401 may be injected into the space surrounded by the second block 421 having the second hollow 422, the window 440, and the mask stick 320. The fluid 401 may pressurize or press the mask stick 320, e.g., at a bottom side of the pressurizing unit. The laser beam irradiated from the laser welding unit 340 may pass through the window 440 and the fluid 401 to be irradiated to an upper surface of the mask stick 320.

In an implementation, the fluid 401 may be a gas, e.g., air. When the fluid 401 is a gas, the fluid 401 may include an inert or inactive gas, e.g., nitrogen, helium, and/or argon, or air. In an implementation, the fluid 401 may be other types of gas that do not react with the laser beam. The fluid 401 may include a gas, and the fluid 401 may be easily removed by discharging the fluid 401 to the atmosphere after the welding process is completed.

In an implementation, the fluid 401 may be a liquid. When the fluid 401 is a liquid, the fluid 401 may include, e.g., water or oil. In an implementation, the fluid 401 may include other types of liquid that do not react with or otherwise affect the laser beam. The fluid 401 may include liquid, and the fluid 401 may be easily removed by absorbing the liquid by a suction device and drying the remaining liquid, after the welding process is completed.

The pressure applied to the mask stick 320 may be controlled by adjusting the amount of the fluid 401 injected into the space surrounded or bounded by the second block 421 (having the second hollow 422), the window 440, and the mask stick 320.

In an implementation, the pressure of the fluid 401 may be applied throughout the area in which the mask frame 110 and the mask stick 320 are welded.

Figure 8A:
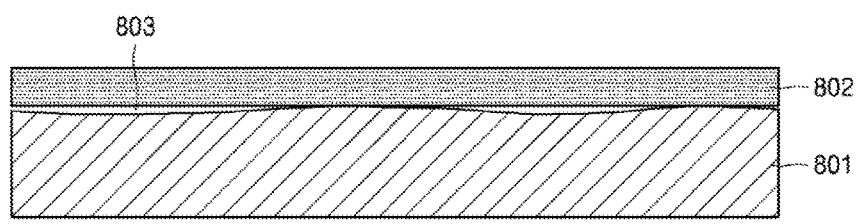
FIG. 8A illustrates an enlarged view of a shape in which a mask and a mask frame adhere to each other, according to a comparative embodiment.

For example, referring to FIG. 8A, according to a comparative embodiment, the pressure may not be applied well to a surface on which a mask frame 801 and a mask 802 adhere to each other, and a gap 803 may occur. Accordingly, a welding defect may occur.

Figure 8B:
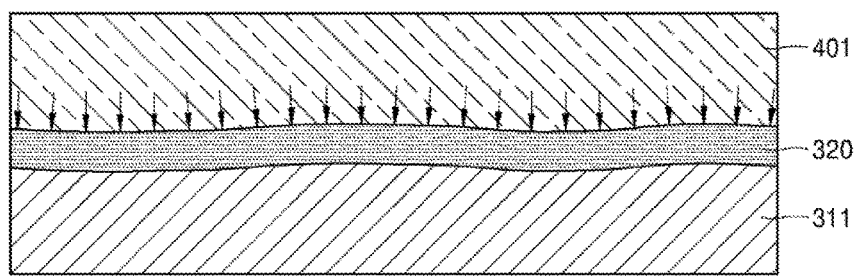
FIG. 8B illustrates an enlarged view of a shape in which a mask and a mask frame adhere to each other, according to an exemplary embodiment.

In contrast, referring to FIG. 8B, according to the present exemplary embodiment, the fluid 401 may apply pressure to the first frame 311 and the mask stick 320. The fluid 401 pressurizes the mask stick 320 until the mask stick 320 adheres to the first frame 311.

Also, after the mask stick 320 adheres to the first frame 311, the fluid 401 may apply a uniform pressure throughout the area in which the mask stick 320 is welded on the first frame 311 in a vertical direction, as indicated by an arrow. Accordingly, a gap may not occur on adhering surfaces of the first frame 311 and the mask stick 320, and welding defects may not be generated.

Referring again to FIGS. 3 to 7, an inlet 425 through which the fluid 401 is injected may be on one side of the lower housing 420. An outlet 426 (through which the fluid 401 is discharged) may be on another side of the lower housing 420.

The lower housing 420 may include a connection passage 424 therein. The fluid 401 injected through the inlet 425 may be injected into the second hollow 422 (formed by the second block 421), and the fluid 401 may be discharged to the outside from the second hollow 422 via the outlet 426. The connection passage 424 may form a hole penetrating the second block 421 to connect the second hollow 422, the inlet 425, and the outlet 426.

In an implementation, a first o-ring 451 may be provided in an area in which the first block 411 and the second block 421 are coupled to each other, e.g., in order to enhance a sealing function thereof. In an implementation, a second o-ring 452 may be provided in an area in which the second block 421 and the mask stick 320 contact each other, e.g., in order to enhance a sealing function thereof.

According to an exemplary embodiment, the second o-ring 452 may be or may include an elastic material to help reduce and/or prevent leakage of the fluid 401 to the outside. For example, the second o-ring 452 may include a polymer, rubber, Teflon, or other elastic materials. In an implementation, the first o-ring 451 may include the same material as the second o-ring 452.

Figure 9:
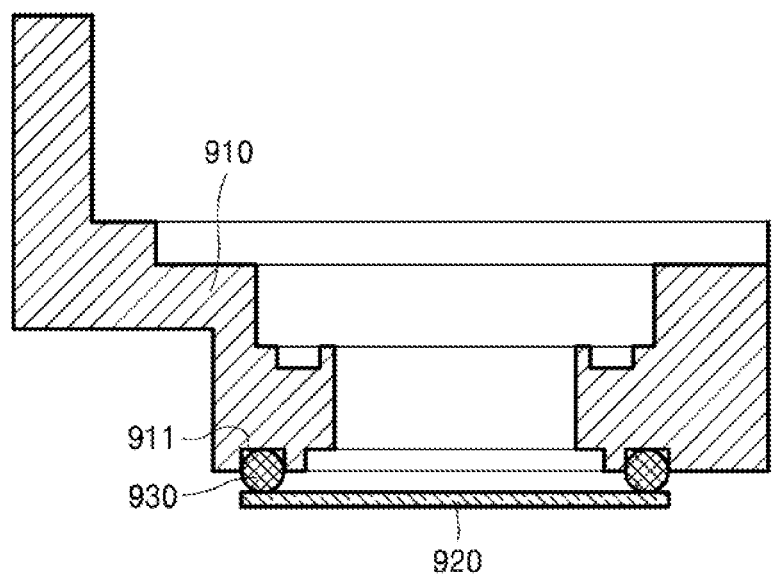
FIG. 9 illustrates a cross-sectional view of a housing according to another exemplary embodiment.

As illustrated in FIG. 9, a portion of an o-ring 930 may protrude from a lower part or portion of a housing 910. For example, the o-ring 930 may be inserted into a space formed below or at a bottom of the housing 910, and at least a portion of the o-ring 930 may be exposed below the housing 901. The o-ring 930 may have a circular shape, e.g., may have a rounded or circular cross-sectional shape. The o-ring 930 may contact a mask 920 and may help reduce and/or prevent leakage of a fluid to the outside of the mask 920.

Figure 10:
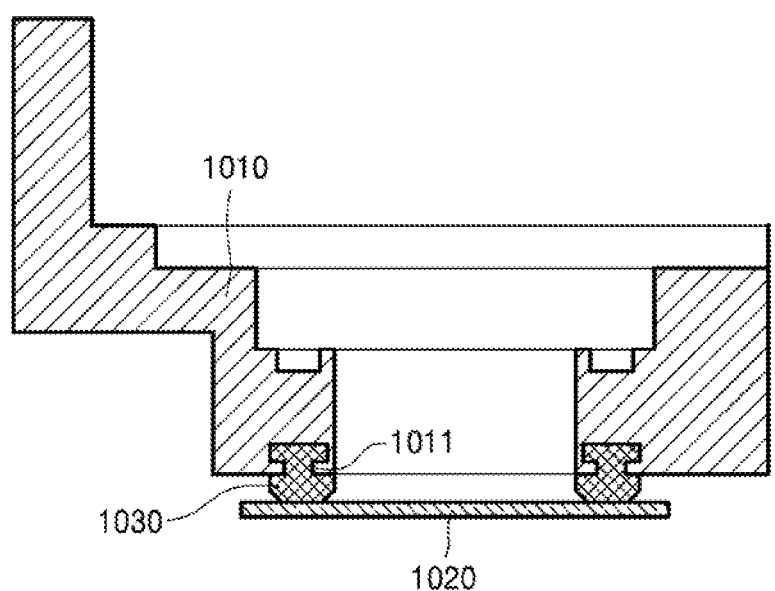
FIG. 10 illustrates a cross-sectional view of a housing according to another exemplary embodiment.

As illustrated in FIG. 10, a portion of an o-ring 1030 may protrude from a lower portion of a housing 1010. For example, a protrusion portion 1011 (having a groove) may be formed on or at a lower end of the housing 1010, and the o-ring 1030 may be inserted into the protrusion portion 1011. At least a portion of the o-ring 1030 may be exposed through or at a lower portion of the housing 1010. The o-ring 1030 may support a mask 1020 and may help reduce and/or prevent leakage of a fluid to the outside of the mask 1020.

An operation of the mask tension welding device 300 for thin film deposition having the above structure will be described by referring to FIGS. 3 through 7.

First, the mask stick 320 may be pulled by the tension unit 330 and may be placed on the mask frame 310. The first end 323 and the second end 324 of the mask stick 320 may be clamped when pulling the mask stick 320.

Next, the pressurizing unit 400 may be placed on the mask stick 320.

Next, the fluid 401 may be injected through the inlet 425 in the lower housing 420. The fluid 401 may be injected into the second hollow 422 in the second block 421 through the connection passage 424.

According to the present exemplary embodiment, the fluid 401 may be injected into the space surrounded or bounded by the second block 421 (having the second hollow 422), the window 440, and the mask stick 320. According to an exemplary embodiment, the pressurizing unit 400 may further enhance a sealing function by using the first o-ring 451 and the second o-ring 452.

The fluid 401 may apply a uniform pressure on an entire area in which the mask stick 320 is welded to the mask frame 310. In an implementation, an amount of pressure applied to the mask stick 320 may be controlled by adjusting the amount of the fluid 401, e.g., the amount of pressure is controllable in response or proportion to an amount of injected fluid 401. Accordingly, in the area in which the mask frame 310 and the mask stick 320 are welded with each other, a gap may not occur, and the mask frame 310 and the mask stick 320 may adhere to each other.

Next, a laser beam may be irradiated from the laser welding unit 340 above the mask stick 320. The laser beam may be irradiated onto an upper surface of the mask stick 320 by passing through the window 440 and the fluid 401. Accordingly, the mask frame 310 and the mask stick 320 may be welded with each other.

Figure 11:
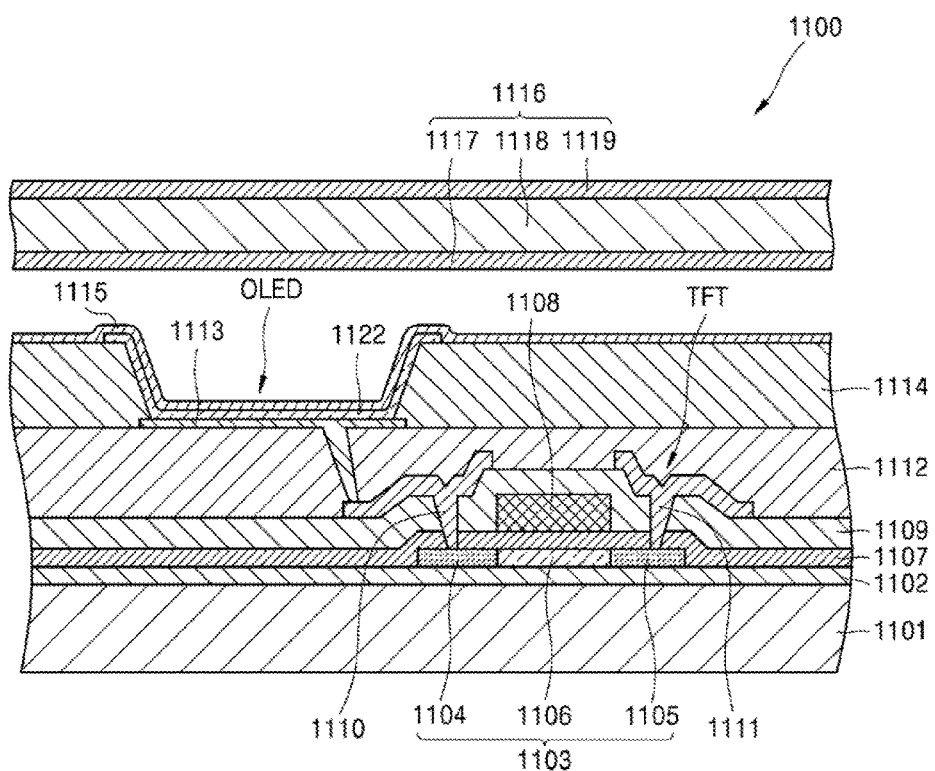
FIG. 11 illustrates a cross-sectional view of a sub-pixel of an organic light-emitting display apparatus according to an exemplary embodiment.

FIG. 11 illustrates a cross-sectional view of a sub-pixel of an organic light-emitting display apparatus 1100, in which an emission layer is deposited on a display substrate 1101 by using the mask tension welding device 300 of FIG. 3.

Referring to FIG. 11, the organic light-emitting display apparatus 1100 may include the display substrate 1101. The display substrate 1101 may be formed by using a flexible insulating material or a rigid insulating material. The display substrate 1101 may be transparent, semi-transparent, or non-transparent.

A barrier layer 1102 may be formed on the display substrate 1101. The barrier layer 1102 may entirely cover an upper surface of the display substrate 1101. The barrier layer 1102 may include an inorganic layer or an organic layer.

A thin film transistor TFT may be formed on the barrier layer 1102. A semiconductor active layer 1103 may be formed on the barrier layer 1102. A source area 1104 and a drain area 1105 may be formed on the semiconductor active layer 1103 by doping n-type impurity ions or p-type impurity ions. An area between the source area 1104 and the drain area 1105 may be a channel area 1106 which is not doped with impurities.

A gate insulating layer 1107 may be deposited on the semiconductor active layer 1103. The gate insulating layer 1107 may include an inorganic layer, e.g., silicon oxide, silicon nitride, or metal oxide. The gate insulating layer 1107 may be a single layer or multiple layers.

A gate electrode 1108 may be formed on an area of the gate insulating layer 1107. The gate electrode 1108 may include a single layer or multiple layers, e.g., including Au, Ag, Cu, Ni, Pt, Pd, Al, Mo, or Cr. The gate electrode 1108 may include an alloy, e.g., Al:Nd or Mo:W.

An interlayer insulating layer 1109 may be formed on the gate electrode 1108. The interlayer insulating layer 1109 may include an inorganic layer, e.g., silicon oxide or silicon nitride, or an organic layer.

A source electrode 1110 and a drain electrode 1111 may be formed on the interlayer insulating layer 1109. For example, a contact hole may be formed in the gate insulating layer 1107 and the interlayer insulating layer 1109 by selectively removing the gate insulating layer 1107 and the interlayer layer 1109. Via the contact hole, the source electrode 1110 may be electrically connected to the source area 1104, and the drain electrode 1111 may be electrically connected to the drain area 1105.

A protection layer 1112 (e.g., a passivation layer and/or a planarization layer) may be formed on the source electrode 1110 and the drain electrode 1111. The protection layer 1112 may include an inorganic layer, e.g., silicon oxide or silicon nitride, or an organic layer, such as acryl, polyimide, or benzocyclobutene.

An organic light-emitting device OLED may be formed on the thin film transistor TFT.

The organic light-emitting device OLED may be formed on the protection layer 1112. The organic light-emitting device OLED may include a first electrode 1113, an intermediate layer 1122 including an organic emission layer, and a second electrode 1115.

The first electrode 1133 may function as an anode, and may be formed of various conductive materials. The first electrode 1113 may be formed as a transparent electrode or a reflection electrode. For example, when the first electrode 1113 is formed as the transparent electrode, the first electrode 1113 may include a transparent conductive layer. When the first electrode 1113 is used as the reflection electrode, the first electrode 1113 may include a reflective layer, and a transparent conductive layer formed on the reflective layer.

A pixel-defining layer 1114 may cover portions of the protection layer 1112 and the first electrode 1113. The pixel-defining layer 1114 may define an emission area of each of sub-pixels, by surrounding a boundary of the first electrode 1113. The first electrode 1113 may be patterned in each sub-pixel. The pixel-defining layer 1114 may be formed of an organic layer or an inorganic layer. The pixel-defining layer 1114 may be formed as a single layer or multiple layers.

The intermediate layer 1122 may be formed on an area of the first electrode 1113, which is exposed by etching a portion of the pixel-defining layer 1114. The intermediate layer 1122 may be formed by a deposition process. The intermediate layer 1122 may be patterned by a deposition material deposited via the deposition pattern unit 321 of the mask stick 320 manufactured by the mask tension welding device 300 of FIG. 3.

The intermediate layer 1122 may include an organic emission layer. In an implementation, the intermediate layer 1122 may include the organic emission layer, and may further include at least one of a hole injection layer (HIL), a hole transport layer (HTL), an electron transport layer (ETL), and an electron injection layer (EIL). In an implementation, the intermediate layer 1122 may include the organic emission layer, and may further include other various function layers.

The second electrode 1115 may be formed on the intermediate layer 1122.

The second electrode 1115 may function as a cathode. The second electrode 1115 may include a transparent electrode or a reflection electrode. For example, when the second electrode 1115 is used as the transparent electrode, the second electrode 1115 may include a metal layer, and a transparent conductive layer formed on the metal layer. When the second electrode 1115 is used as the reflection electrode, the second electrode 1115 may include a metal layer.

According to an exemplary embodiment, a plurality of sub-pixels may be formed on the display substrate 1101, and each sub-pixel may realize a red, green, blue, or white color of light.

A sealing substrate 1116 may be formed on the organic light-emitting device OLED. The sealing substrate 1116 may be formed to protect the intermediate layer 1122 and other thin films from external water or oxygen. The sealing substrate 1116 may include a glass having rigidity, a polymer resin, or a film having flexibility. The sealing substrate 1116 may be formed by alternately stacking organic layers 1117 and 1119 and an inorganic layer 1118 on the organic light-emitting device OLED. According to an exemplary embodiment, the organic layers 1117 and 1119 may include at least one organic layer and the inorganic layer 1118 may include at least one inorganic layer.

As described above, according to the one or more of the above exemplary embodiments, the mask tension welding device for thin film deposition may reduce welding defects of the mask with respect to the mask frame. Thus, deposition patterns may be easily formed on desired locations of the substrate.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A mask tension welding device for welding a mask for thin film deposition on a mask frame, the mask tension welding device comprising:
   a tension unit to pull the mask in one direction;
   a pressurizing unit to press the mask to the mask frame, the pressuring unit including:
      an upper housing,
      a lower housing coupled to the upper housing,
      a window between the upper housing and the lower housing,
      a space in the lower housing into which a fluid is injectable, and
      an inlet and an outlet to provide a passage through which the fluid is injected and discharged; and
   a laser welding unit to weld the mask and the mask frame to each other, wherein a laser beam irradiated from the laser welding unit passes through the window and the fluid to be irradiated on an upper surface of the mask, and wherein:
the upper housing includes a first block in which a first hollow is formed,
the lower housing includes a second block in which a second hollow is formed,
the first block is coupled with the second block,
the space into which the fluid is injectable is bounded by the second block having the second hollow, the window, and the mask, and
a pressure applied to the mask is controllable in response to an amount of the fluid injected into the space.

2. The mask tension welding device as claimed in claim 1, wherein the tension unit includes a mask tension clamp to pull ends of the mask and to fix the ends of the mask on the mask frame.

3. The mask tension welding device as claimed in claim 1, wherein the pressurizing unit pressurizes the mask on the mask frame to make facing surfaces of the mask frame and the mask adhere to each other.

4. The mask tension welding device as claimed in claim 1, wherein:
a first bent portion is bent along a circumferential area of the first hollow at a lower end of the first block,
a second bent portion is bent along a circumferential area of the second hollow at an upper end of the second block facing the lower end of the first block, and
the first bent portion and the second portion are coupled with each other.

5. The mask tension welding device as claimed in claim 1, wherein the window is between the first hollow and the second hollow to separate the first hollow and the second hollow from each other.

6. The mask tension welding device as claimed in claim 5 wherein the window is glass, quartz, or a transparent polymer.

7. The mask tension welding device as claimed in claim 1, wherein the fluid is a gas.

8. The mask tension welding device as claimed in claim 1, wherein the fluid is a liquid.

9. The mask tension welding device as claimed in claim 1, wherein the pressure of the fluid is applied to an entire area in which the mask and the mask frame are welded.

10. The mask tension welding device as claimed in claim 1, wherein the pressurizing unit includes a first o-ring in an area in which the first block and the second block are coupled to each other.

11. The mask tension welding device as claimed in claim 1, wherein the pressurizing unit includes a second o-ring in an area in which the second block and the mask contact each other.

12. The mask tension welding device as claimed in claim 11 wherein the second o-ring includes an elastic material.

13. The mask tension welding device as claimed in claim 1, wherein:
the inlet through which the fluid is injected is on one side of the lower housing, and
the outlet through which the fluid is discharged is on another side of the lower housing.

14. The mask tension welding device as claimed in claim 13, wherein the upper housing includes a connecting passage connecting the inlet, the second hollow, and the outlet.

15. The mask tension welding device as claimed in claim 1, wherein:
the mask includes at least one mask stick, and
ends of the mask stick are welded on the mask frame.

16. A mask tension welding device for welding a mask for thin film deposition on a mask frame, the mask tension welding device comprising:
a tension unit to pull the mask in one direction;
a pressurizing unit to press the mask to the mask frame to make facing surfaces of the mask frame and the mask adhere to each other, the pressuring unit including:
an upper housing,
a lower housing coupled to the upper housing,
a window between the upper housing and the lower housing,
a space in the lower housing into which a fluid is injectable, and
an inlet and an outlet to provide a passage through which the fluid is injected and discharged; and
a laser welding unit to weld the mask and the mask frame to each other,
wherein:
the upper housing includes a first block in which a first hollow is formed,
the lower housing includes a second block in which a second hollow is formed,
the first block is coupled with the second block,
the space into which the fluid is injectable is bounded by the second block having the second hollow, the window, and the mask, and
a pressure applied to the mask is controllable in response to an amount of the fluid injected into the space.

17. A mask tension welding device for welding a mask for thin film deposition on a mask frame, the mask tension welding device comprising:
a tension unit to pull the mask in one direction;
a pressurizing unit to press the mask to the mask frame to make facing surfaces of the mask frame and the mask adhere to each other, the pressuring unit including:
an upper housing,
a lower housing coupled to the upper housing,
a window between the upper housing and the lower housing,
a space in the lower housing into which a fluid is injectable, and
an inlet and an outlet to provide a passage through which the fluid is injected and discharged; and
a laser welding unit to weld the mask and the mask frame to each other,
wherein:
the upper housing includes a first block in which a first hollow is formed,
the lower housing includes a second block in which a second hollow is formed,
the first block is coupled with the second block,
the inlet through which the fluid is injected is on one side of the lower housing,
the outlet through which the fluid is discharged is on another side of the lower housing, and
the upper housing includes a connecting passage connecting the inlet, the second hollow, and the outlet.

* * * * *